United States Patent [19]

Essig et al.

[11] Patent Number: 5,613,531
[45] Date of Patent: Mar. 25, 1997

[54] DEVICE FOR ALIGNING THE CONTACT FEET ARRANGED ON THE EDGE OF AN IC COMPONENT

[75] Inventors: Bernhard Essig, Riesbuerg-Goldburghausen; Peter Klein, Noerdlingen; Karl Kornmann, both of Noerdlingen-Loepsingen, all of Germany

[73] Assignee: Rood Technology Deutschland GmbH, Noerdlingen

[21] Appl. No.: 385,655

[22] Filed: Feb. 8, 1995

[30] Foreign Application Priority Data

Feb. 8, 1994 [DE] Germany ............................ 44 03 804.6

[51] Int. Cl.⁶ ........................................................ B21F 45/00
[52] U.S. Cl. ........................................................ 140/147
[58] Field of Search ................................. 140/105, 140, 140/147

[56] References Cited

U.S. PATENT DOCUMENTS 5,301,720  4/1994  Plummer, Jr. et al. ............... 140/147
5,431,197  7/1995  Linker, Sr. et al. ................... 140/147

*Primary Examiner*—Lowell A. Larson
*Attorney, Agent, or Firm*—Antonelli, Terry, Stout & Kraus, LLP

[57] ABSTRACT

A device for aligning contact feet extending from the edge of an integrated circuit (IC) component has a toothed adjusting tool whose prongs are moved in the gaps between the contact feet. When the adjusting tool moves upward in the direction of the Z axis, a first adjusting plate, located below the prongs and overlapping the gaps between the prongs, comes into contact with the contact feet, which are thereby bent upward. When the adjusting tool is subsequently moved downward, a second adjusting plate, located above the prongs, comes into contact with the contact feet and bends all of them downward to a nominal size.

20 Claims, 2 Drawing Sheets 5,613,531

DEVICE FOR ALIGNING THE CONTACT FEET ARRANGED ON THE EDGE OF AN IC COMPONENT

FIELD OF THE INVENTION

This invention relates to a device for aligning contact feet located along the edge of an integrated circuit (IC) component.

BACKGROUND TO THE INVENTION

A device of this type is the subject of U.S. Pat. No. 5,219,404. In that device, the IC component is held by a clamping device between four adjusting tools, having L-shaped prongs. When the component is held in position, the adjusting tools move diagonally to the plane of the component, whereby the prongs are moved into gaps between the contact feet. When this movement is completed, the ends of the contact feet are between the prongs. The adjusting tools then oscillate diagonally to the run of the contact feet, as a result of which the mutual distance between the contact feet is brought to a nominal size.

The component is then guided to a further work station in which the contact feet are bent at right angles to the plane of the component. An adjusting plate then drives against the bent contact feet, as a result of which their ends are pressed away from the component. The result of this is that the ends of the contact feet are located in one plane.

This prior art device is expensive due to it requiring two aligning stations and a conveying station between two aligning stations. Another disadvantage is that the contact feet are forcefully bent twice in the second station, which can lead to cracks in the contact feet. Moreover, there is no guarantee that the ends of all of the contact feet are in the same plane.

SUMMARY OF THE INVENTION

It is an object of the present invention to provide a device which aligns the contact feet in one operation in an aligning station.

In accordance with the present invention, a device for aligning contact feet arranged along the edge of an integrated circuit (IC) component, is comprised of a clamping device for holding the component in position and a toothed adjusting tool, the prongs of which being moveable in gaps between the contact feet, the adjusting tool being moveable in a first movement diagonally to the plane of the component and which can relatively oscillate with the contact feet diagonally to the run of the contact feet when the prongs are engaged with the contact feet, a first adjusting plate overlapping the gaps between the prongs being situated on one side of the prongs, the adjusting plate running up against ends of the contact feet when the first movement of the adjusting tool is completed and bending it in the direction of the first movement, a second adjusting plate located parallel to the first adjusting plate at a distance from the prongs on the other side of the prongs, the adjusting tool being moveable in a second movement opposite to the first movement, the second adjusting plate running up against the ends of the contact feet when the second movement is completed and bending them backward in the direction of the second movement.

BRIEF INTRODUCTION TO THE DRAWINGS

An embodiment of the invention is described in greater detail below with reference to the drawings in which.

DETAILED DESCRIPTION OF THE INVENTION

Figure 1:
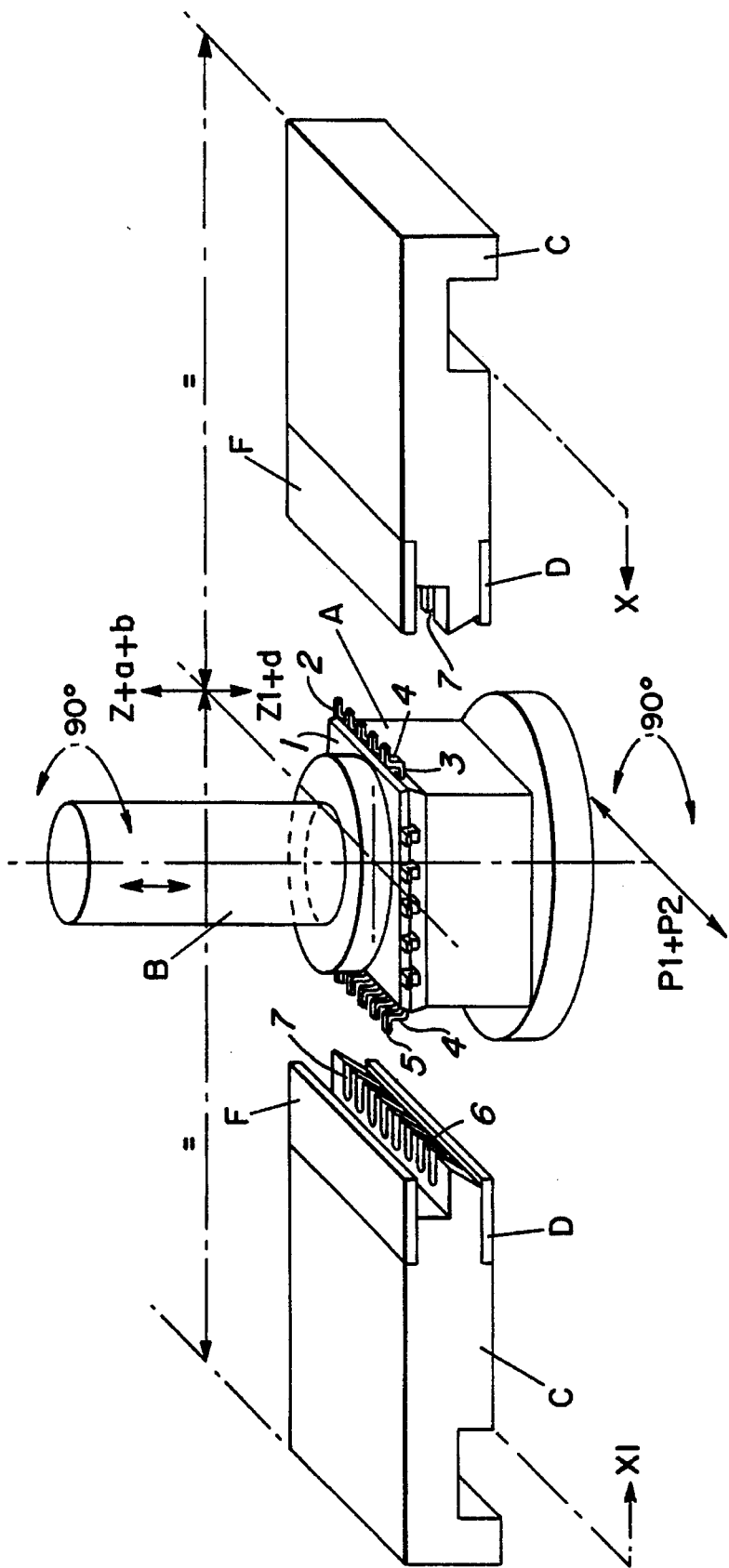
FIG. 1 is a schematic perspective view of the device.

The coordinates X, Y and Z are used to illustrate the operating sequences wherein the coordinates X and Y form a horizontal plane and the coordinates X and Z form a vertical plane.

As a clamping device, the device has a receiving block A and a stamper B, between which the IC component 1 can be firmly clamped. The component 1 is flat and rectangular and has contact feet 2 arranged along its edges, each of the contact feet consisting of a horizontally extending mounting leg 3, a vertically extending centre leg 4 and a horizontally extending end 5.

Two adjusting tools C are placed opposite one another, the adjusting tools being toothed, i.e. having prongs, on their sides facing the component 1. A first adjusting plate D is located below the prongs 6 and a second adjusting plate F is located at a distance above the prongs 6. The prongs extend diagonally upward along their front sides in the direction of the component 1. The first adjusting plate D protrudes slightly beyond the lower edge of the prongs 6. Both adjusting plates D and F extend horizontally, parallel to one another, whereby their front edges are in vertical alignment with one another. The distance 7 between the prongs 6 corresponds to the distance of the contact feet 2 to one another, with the width of each of the gaps 7 being slightly wider that the width of each of the contact feet 2.

At the beginning of a work cycle, the clamping device is located outside of the region of the adjusting tools C, that is, is shifted from the illustrated position in the direction Y1. A component 1 is inserted into the receiving block A, subsequent to which the stamper B travels vertically downward, so that the component 1 is held in position between the receiving block A and the stamper B. At the same time, the adjusting tools travel horizontally in the direction X and X1 toward one another until the distance between the upper edges of the prongs 6 of the two adjusting tools C is less than the width of the component 1. The clamping device is now shifted in the direction of the adjusting tools C, whereby the left and right contact feet 2 reach the region between the prongs 6 and the adjusting plate F. At the end of this movement the direction Y, the left and right contact feet 2 are above the gaps 7 between the prongs 6.

Figure 2:
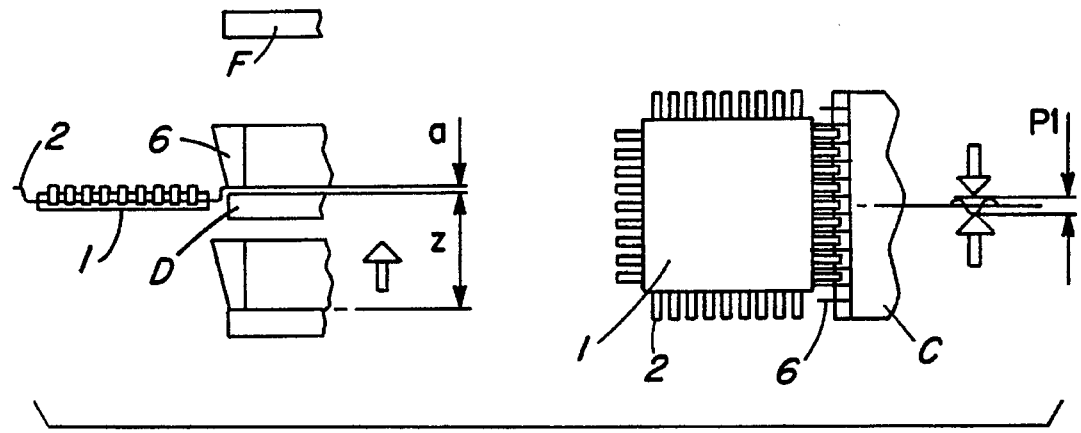
FIG. 2 is a partial representation of the device to illustrate a first step.
Figure 3:
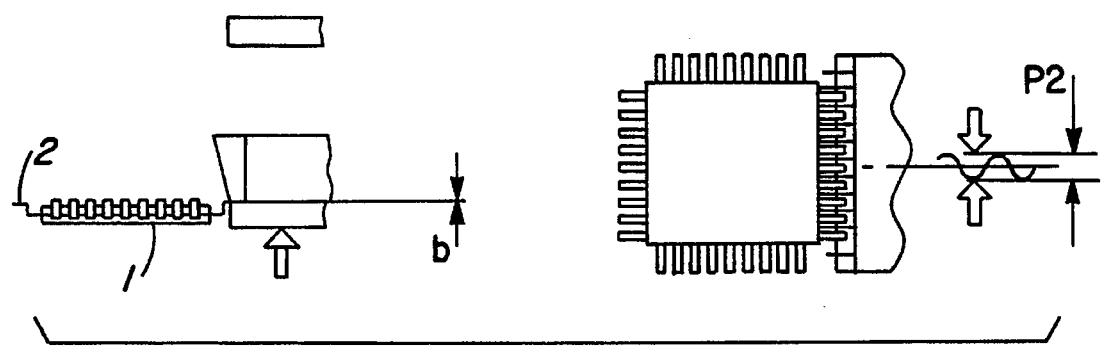
FIG. 3 is a partial representation of the device to illustrate a second step and FIG. 4 is a partial representation of the device to illustrate a third step.
Figure 4:
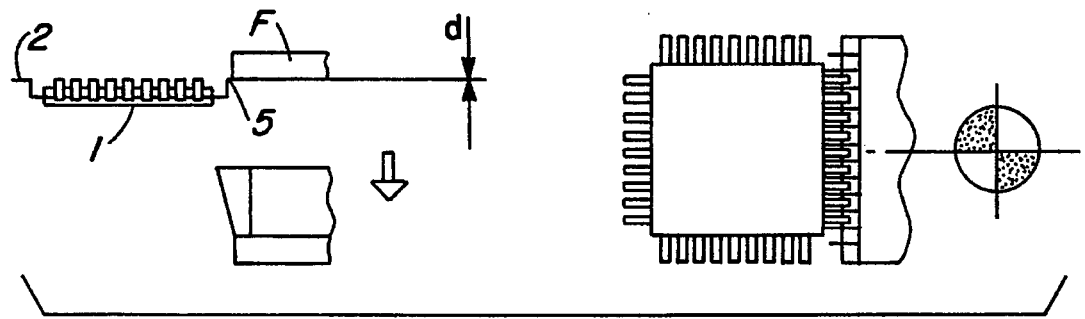

Both adjusting tools C are now driven upward in direction Z, whereby the prongs 6 engage in the gaps between the contact feet 2. During this upward movement, the clamping device carries out an oscillating movement with the amplitude P1 in the direction of the Y axis. As a result, any contact feet 2 which might be inclined are aligned parallel to the other contact feet 2. At the start of this shift movement, the upper edges of the prongs 6 are located between the mounting legs 3, while only the ends 5 are between the prongs 6 at the end of the shift movement as per FIG. 2.

When the adjusting tools C continue to travel upward by the amount a, the ends 5 come into contact with the adjusting plate D. Once this contact is made, the adjusting tools C are driven upward by a further amount b, so that all the left and right contact feet are bent upward by this amount. The oscillating amplitude is simultaneously increased to P2.

The adjusting tools C are now driven downward in direction Z1 until the ends 5 come into contact with the adjusting plates F. In this case, the clamping device no longer carries out an oscillating movement. Once the ends 5 are in contact with the adjusting plates F, the adjusting tools C are driven further downward by the amount d, so that the contact feet 2 are bent downward. Thus, the ends 5 of the left and right contact feet 2 are located in the same horizontal plane. The adjusting tools are then shifted upward again, until the contact feet are located in the space between the prongs 6 and the adjusting plates F. The adjusting tools C are now driven apart and the clamping device is turned about the axis Z by 90. After the adjusting tools C are driven together again as noted above, the aforementioned steps are repeated. If all of the contact feet 2 are aligned with respect to the reciprocal distance and also with respect to the common plane of the ends 5, then the clamping device is driven horizontally in direction Y1, the stamper B is driven upward and the component 1 is removed from the receiving block A.

We claim:

1. A device for aligning contact feet arranged along the edge of an integrated circuit (IC) component, comprising a clamping device for holding the component in position and a toothed adjusting tool, said tool comprising prongs which are inclined upwardly along their front sides in the direction of the component and being moveable in gaps between the contact feet, the adjusting tool being moveable in a first movement orthogonal to the plane of the component and which can relatively oscillate with the contact feet in a first oscillating movement orthogonal to a run of the contact feet when the prongs are engaged with the contact feet, a first adjusting plate overlapping gaps between the prongs and being situated on one side of the prongs, said adjusting plate running up against ends of the contact feet which are between the prongs when the first movement of the adjusting tool is completed and bending the contact feet in the direction of the first movement, the adjusting tool and the contact feet being relatively movable in a second oscillation movement orthogonal to the run of the contact feet having greater amplitude than during the first oscillation movement and being produced when the first adjusting plate bends the contact feet, a second adjusting plate located parallel to the first adjusting plate at a distance from the prongs on the other side of the prongs, the adjusting tool being moveable in a second movement opposite to the first movement, the second adjusting plate running up against the ends of the contact feet when the second movement is completed and bending the contact feet backward in the direction of the second movement.

2. A device as defined in claim 1, wherein the clamping device can travel back and forth from a first loading and unloading position outside of the adjusting tool into a second position, the contact feet projecting into the space between the prongs and the second adjusting plate in the second position.

3. A device as defined in claim 2, wherein the oscillating movement is produced by the clamping device.

4. A device as defined in claim 3, wherein a first oscillating movement is produced during the first movement and a second oscillating movement of a greater amplitude is produced when the first adjusting plate bends the contact feet.

5. A device as defined in claim 4, including two adjusting tools arranged mirror-inverted to one another which can travel against one another.

6. A device as defined in claim 4, wherein the clamping device is rotatable about an axis which is orthogonal to the plane of the IC component.

7. A device as defined in claim 4, wherein the prongs are wedge-shaped and are spaced closer to the IC component on their sides facing the second adjusting plate than on their sides adjoining the first adjusting plate.

8. A device as defined in claim 2, wherein a first oscillating movement is produced during the first movement and a second oscillating movement of a greater amplitude is produced when the first adjusting plate bends the contact feet.

9. A device as defined in claim 2, including two adjusting tools arranged mirror-inverted to one another which can travel against one another.

10. A device as defined in claim 2, wherein the clamping device is rotatable about an axis which is orthogonal to the plane of the IC component.

11. A device as defined in claim 2, wherein the prongs are wedge-shaped and are spaced closer to the IC component on their sides facing the second adjusting plate than on their sides adjoining the first adjusting plate.

12. A device as defined in claim 1, wherein the oscillating movement is produced by the clamping device.

13. A device as defined in claim 12, wherein a first oscillating movement is produced during the first movement and a second oscillating movement of a greater amplitude is produced when the first adjusting plate bends the contact feet.

14. A device as defined in claim 12, including two adjusting tools arranged mirror-inverted to one another which can travel against one another.

15. A device as defined in claim 12, wherein the clamping device is rotatable about an axis which is orthogonal to the plane of the IC component.

16. A device as defined in claim 1, wherein a first oscillating movement is produced during the first movement and a second oscillating movement of a greater amplitude is produced when the first adjusting plate bends the contact feet.

17. A device as defined in claim 1, including two adjusting tools arranged mirror-inverted to one another which can travel against one another.

18. A device as defined in claim 17, wherein the clamping device is rotatable about an axis which is orthogonal to the plane of the IC component.

19. A device as defined in claim 1, wherein the clamping device is rotatable about an axis which is orthogonal to the plane of the IC component.

20. A device as defined in claim 1, wherein the prongs are wedge-shaped and are spaced closer to the IC component on their sides facing the second adjusting plate than on their sides adjoining the first adjusting plate.

* * * * *